United States Patent
Przybysz

(10) Patent No.: US 10,366,340 B2
(45) Date of Patent: Jul. 30, 2019

(54) SYSTEM AND METHOD FOR QUBIT READOUT

(71) Applicant: Anthony Joseph Przybysz, Linthicum, MD (US)

(72) Inventor: Anthony Joseph Przybysz, Linthicum, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/648,243

(22) Filed: Jul. 12, 2017

(65) Prior Publication Data

US 2019/0019098 A1 Jan. 17, 2019

(51) Int. Cl.
| | |
|---|---|
| *H03K 3/38* | (2006.01) |
| *G06N 10/00* | (2019.01) |
| *G11C 11/44* | (2006.01) |
| *H03K 19/195* | (2006.01) |

(52) U.S. Cl.
CPC .............. *G06N 10/00* (2019.01); *G11C 11/44* (2013.01); *H03K 3/38* (2013.01); *H03K 19/195* (2013.01)

(58) Field of Classification Search
None
See application file for complete search history.

(56) References Cited

U.S. PATENT DOCUMENTS

| | | | |
|---|---|---|---|
| 4,800,345 A | 1/1989 | Podell | |
| 5,818,308 A | 10/1998 | Tanaka | |
| 6,346,863 B2 | 2/2002 | Sasaki | |
| 6,407,647 B1 | 6/2002 | Apel | |
| 6,636,126 B1 | 10/2003 | Pozdeev | |
| 6,747,525 B2 | 6/2004 | Iida | |
| 6,765,455 B1 | 7/2004 | De Lillo | |
| 6,806,558 B2 | 10/2004 | Apel | |
| 9,257,736 B1 | 2/2016 | Josypenko | |
| 9,438,246 B1 * | 9/2016 | Naaman | H03K 19/195 |
| 9,866,711 B2 * | 1/2018 | Iwashima | H04N 1/00344 |
| 2003/0218516 A1 | 11/2003 | Gilbert | |
| 2004/0189388 A1 | 9/2004 | Nguyen | |
| 2006/0220737 A1 | 10/2006 | Sanderson | |

(Continued)

FOREIGN PATENT DOCUMENTS

| | | |
|---|---|---|
| WO | 9836467 | 8/1998 |
| WO | 2017127205 A1 | 7/2017 |

OTHER PUBLICATIONS

Allman, Michael S., et al. "rf-SQUID-mediated coherent tunable coupling between a superconducting phase qubit and a lumped-element resonator." Physical review letters 104.17 (2010): 177004.

(Continued)

*Primary Examiner* — Crystal L Hammond
(74) *Attorney, Agent, or Firm* — Tarolli, Sundheim, Covell & Tummino LLP

(57) ABSTRACT

Systems and methods are provided for readout of a qubit. A readout resonator is coupled to a transmission line and a compound Josephson junction coupler couples the qubit to the readout resonator. A coupling controller controls the coupling strength of the compound Josephson junction coupler such that a coupling between the qubit and the readout resonator is a first value when a state of the qubit is being read and a second value during operation of the qubit.

20 Claims, 2 Drawing Sheets

(56) References Cited

U.S. PATENT DOCUMENTS

| | | | |
|---|---|---|---|
| 2009/0189712 A1 | 7/2009 | Jiang | |
| 2010/0148853 A1 | 6/2010 | Harris et al. | |
| 2012/0319085 A1* | 12/2012 | Gambetta | G06N 99/002 257/31 |
| 2016/0112031 A1* | 4/2016 | Abraham | H03K 19/1954 327/528 |
| 2016/0267032 A1* | 9/2016 | Rigetti | G06N 99/002 |
| 2017/0005255 A1* | 1/2017 | Dial | H01L 39/14 |
| 2017/0062692 A1* | 3/2017 | Dial | H01P 1/205 |
| 2017/0116542 A1* | 4/2017 | Shim | G06N 99/002 |
| 2017/0148972 A1* | 5/2017 | Thompson | H01L 39/025 |
| 2017/0193388 A1* | 7/2017 | Filipp | G06N 10/00 |
| 2017/0201224 A1 | 7/2017 | Strong | |
| 2017/0212860 A1* | 7/2017 | Naaman | G06F 13/4027 |
| 2017/0213143 A1* | 7/2017 | Chow | G06N 99/002 |
| 2017/0262765 A1* | 9/2017 | Bourassa | G06N 99/002 |
| 2018/0003753 A1* | 1/2018 | Bishop | G01R 29/0892 |
| 2018/0013052 A1* | 1/2018 | Oliver | H01L 25/0657 |

OTHER PUBLICATIONS

Harris, R., et al. "Compound Josephson-junction coupler for flux qubits with minimal crosstalk." Physical Review B 80.5 (2009): 052506.

Australian Search Report corresponding to Australian Patent Application No. 2016388350, dated Jan. 7, 2019.

Chen,Y. et al. "Qubit architecture with high coherence and fast tunable coupling." Physical review letters 113.22 2014):220502.

Birenbaum, J.S. (2014). "The C-shunt Flux Qubit: A New Generation of Superconducting Flux Qubit," Jan. 1, 2014 (Jan. 1, 2014), XP055510806,eScholarship. Retrieved from: https://escholarship.org/uc/i tem/3gg7j 6rh[retri eved on Sep. 27, 2018];section 2.5.1; figure 2.10(b).

Robertson, et al. (2016). "Superconducting device to isolate, entangle, and read out quantum flux states", Mar. 21, 2016 (Mar. 21, 2016), pp. 1-4, XP0555Ie798,Research Gate Retrieved from: https://www.researchgate .net/publication/255276503; Superconducting_device_ to_isolate_entangle_and read_out_quantum_flux_sates.[retrieved on Sep. 27, 2018] abstract figure 1, p. 1, left-hand column, line 1, paragraph 2—right-hand column, line 3 p. 2, right-hand column.

Schmitt, et al. (2014). "Multiplexed readout of transmon qubits with Josephson bifubrication amplifiers," Phys. Review A (Atomic, Molecular, and Optical Physics), vol. 90, No. 6, Dec. 1, 2014, XP)55511194, USA ISSN: 1050-2947, DOI: 10.1103/PhysRevA. 90.062333. Abstract section 1, paragraphs 2 and 3; section 2, first paragraph figure 1.

Written Opinion and Search Report corresponding to International Application No. PCT/US2018/040718, dated Oct. 10, 2018.

* cited by examiner

SYSTEM AND METHOD FOR QUBIT READOUT

This invention was made with Government support under Contract No. 30059298. The Government has certain rights in this invention.

TECHNICAL FIELD

The present invention relates generally to superconducting circuits, and more particularly to a system and method for qubit readout.

BACKGROUND

In quantum computer architectures based on circuit quantum electrodynamics (cQED), it is a common practice to multiplex a plurality of qubit readout resonators onto a single transmission line. This can be done by coupling each of the qubit readout resonators having a slightly different resonant frequency via a fixed mutual inductance or a fixed capacitor to the transmission line, with typical coupling Q's of the order of several thousands. While stronger coupling is usually desirable for faster readout times, it also contributes to higher decoherence in the circuit, limiting the time that the circuit is available for computation. Readout fidelity of qubits is partially limited by the qubit energy relaxation through the resonator into the transmission line. Additionally, it is desirable to isolate the qubits from the transmission during logic and/or storage operations of the qubit. Current techniques suffer in either strong coupling and/or isolation of the qubit readout resonators to and from the single 50 ohm transmission line.

SUMMARY

In one example, a system is provided for readout of a qubit. A readout resonator is coupled to a transmission line and a compound Josephson junction coupler couples the qubit to the readout resonator. A coupling controller controls the coupling strength of the compound Josephson junction coupler such that a coupling between the qubit and the readout resonator is a first value when a state of the qubit is being read and a second value during operation of the qubit.

In another example, a method is provided for readout of a qubit at a readout resonator. A first value of a control flux is provided to a tunable coupler linking the qubit and the readout resonator such that the qubit is substantially isolated from the readout resonator. A quantum operation is performed at the qubit. A second value of the control flux is provided to the tunable coupler such that the qubit is coupled to the readout resonator. A shift in the frequency of the readout resonator is measured to determine a state of the qubit.

In a further example, a system is provided for readout of a qubit. A readout resonator is coupled to a transmission line. A compound Josephson junction coupler couples the qubit to the readout resonator. A coupling controller controls the coupling strength of the compound Josephson junction coupler such that a coupling between the qubit and the readout resonator is a first value, representing a strong coupling between the qubit and the readout resonator, when a state of the qubit is being read and a second value, representing substantial isolation of the qubit and the resonator, during operation of the qubit.

DETAILED DESCRIPTION

The present disclosure relates generally to superconducting circuits, and more particularly to a system and method for readout of qubits. In one example, a tunable coupler can be utilized between a qubit and a corresponding readout resonator, such that the readout resonator can be strongly coupled to the environment, but the qubit can be isolated from the resonator most of the time. Fast DC pulses on the coupler control lines are used to activate the coupler on during readout. During readout the coupler is active briefly, but during qubit operations the coupler is inactive, such that the qubit and the readout resonator are isolated. This allows for strong coupling between qubit and readout resonator during the readout operation, but provides isolation during quantum operations. Accordingly, a higher signal to noise can be achieved during readout while preserving the coherence of qubit during gate operations.

The invention provides several advantages over the conventional method of using a fixed coupling. First, the coupler can be designed such that the coupling energy between the readout and the qubit is very large when the coupler is turned on. This will cause a very large shift in $f_r$ during readout, which increases the signal-to-noise ratio (SNR). Second, the readout resonator can be strongly coupled to the drive line, which increases the rate at which one can extract information about the readout resonator. Normally, these two design choices would reduce the lifetime of the qubit, but since we can turn the coupling off, the lifetime of the qubit is not affected during gate operation.

Figure 1:
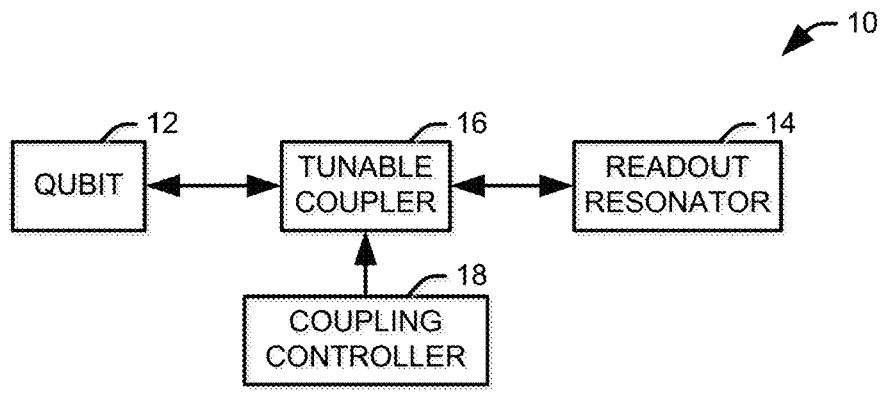
FIG. 1 illustrates a schematic block diagram of a system for reading a state of a qubit.

FIG. 1 illustrates a schematic block diagram of a system 10 for reading a state of a qubit 12. The system 10 includes the qubit 12, a readout resonator 14, and a tunable coupler 16 between the qubit 12 and the readout resonator 14. The tunable coupler is an RF-SQUID with a small inline DC-SQUID, known as a compound Josephson junction (CJJ), which acts as a tunable mutual inductance between two elements. The magnetic susceptibility of the coupler can be tuned by applying flux to either the main inductor of the RF-SQUID or to the CJJ. Using this coupler 16, a tunable mutual inductance can be changed in situ.

One difficulty in qubit design is optimizing the coupling of the qubit to the readout resonator. The readout resonator 14 should be relatively strongly coupled to the drive line to allow it to be read quickly. However, the resonator 14 presents a loss mechanism for the qubit 12 due to the low external quality factor of the resonator 14. Therefore, the coupling, g, of the resonator 14 to the qubit 12 is designed to be small. Unfortunately, the shift, δ, in the fundamental frequency of the resonator 14, $f_r$, used for readout of the state of the qubit 12 is proportional to $g^2$. These factors leave us with a low signal that requires a long integration of the drive signal and many averages to determine the qubit state.

Accordingly, the tunable coupler 16 can be controlled via a coupling controller 18 that controls the coupling strength of the compound Josephson junction such that a coupling between the qubit and the readout resonator is a first value when a state of the qubit is being read and a second value during operation of the qubit. In one example, the first value represents a strong coupling between the qubit and the readout resonator, for example, a mutual inductance between twenty and fifty picohenries, and the second value represents substantial isolation of the qubit from the readout resonator, such as a mutual inductance near zero. The coupling controller 18 can utilize single flux quantum (SFQ) logic (e.g., reciprocal quantum logic (RQL) logic), and/or conventional logic. In one implementation, one or more fast DC pulses can be applied via a coupler control line (not shown) to turn the coupler on during readout. During qubit operation, the coupler will be DC biased and held in a state providing near zero coupling.

The system of FIG. 1 significantly provides an improved signal from coupling the qubit 12 more strongly to the readout resonator 14 during readout. This allows for the use of amplifiers with high noise temperatures and higher one decibel compression points. The system facilitates frequency multiplexing of multiple experiments on the same amplifier whereas the current systems must use quantum limited amplifiers with very low noise temperatures, but low one decibel compression points, which allow for relatively few qubit devices per amplifier. This represents a significant cost savings.

Figure 2:
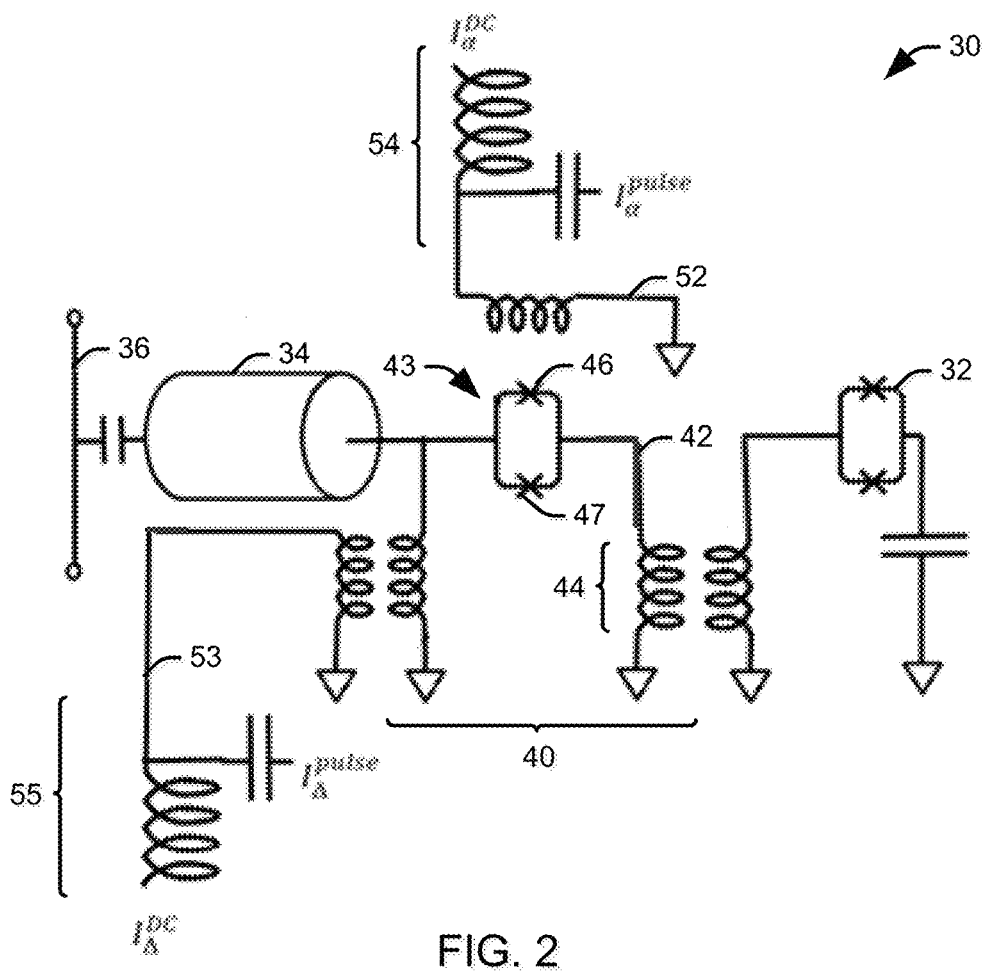
FIG. 2 illustrates a schematic of one example of a circuit for reading a state of a qubit.

FIG. 2 illustrates a schematic of one example of a circuit 30 for reading a state of a qubit. The circuit 30 includes a transmon qubit 32, a readout resonator 34, a feedline 36, and a tunable compound Josephson junction (CJJ) coupler 40, comprising a superconducting loop 42 interrupted by a CJJ 43 to form an RF superconducting SQUID. The readout resonator 34 shares some inductance, with the superconducting loop 40. The superconducting loop 42 also includes an inductor making up one half of a two-inductor transformer 44 which gives a mutual inductance, $M_q$, to the qubit. In the illustrated implementation, the CJJ 43 includes two identical Josephson junctions 46 and 47.

Fluxes, $\Phi_\alpha$ and $\Phi_\Delta$, can be applied to the CJJ 43 and superconducting loop 42, respectively, by applying current to the first 52 and second 53 control lines, respectively. Bias tees 54 and 55 on the control lines 52 and 53 can be used in order to allow for both DC and pulsed signals to be applied to the coupler. The coupler represents an effective mutual inductance, $M_{eff} = M_q M_r \chi$, where $\chi$ is the magnetic susceptibility, $dI_p/d\Phi_\Delta$, of the coupler, that is, the change in the persistent current, $dI_p$, generated in the coupler by a change in the flux in the coupler body, $d\Phi_\Delta$.

The magnetic susceptibility is a function of the flux applied to the CJJ, and, for a situation in which $\Phi_\Delta = 0$, can be expressed as:

$$\chi(\Phi_\alpha) = \frac{\beta_{eff}(\Phi_\alpha)}{L_{co}(1 + \beta_{eff}(\Phi_\alpha))}$$

where it is assumed that $L_{co}$ is the total geometrical inductance of the coupler, $$\beta_{eff}(\Phi_\alpha) = \frac{2\pi L_{co} I_c}{\Phi_0} \cos\left(\frac{\pi \Phi_\alpha}{\Phi_0}\right),$$

$\Phi_0$ is the magnetic flux quantum, approximately equal to 2.07 femtowebers, and $I_c$ is the combined critical current of the two junctions in the CJJ.

In the illustrated example, the coupling to the second control line 53 is a source of decoherence in the qubit 32, whereas the qubit is isolated from dissipation from the first control line 52. Just as changing the magnetic susceptibility changes the coupling between the qubit 32 and the resonator 34, it also tunes the coupling of the coupler 36 to the second control line 53. Accordingly, in implementations in which the second control line 53 is used, a very small coupling to the second control line is utilized, and the second control line is used only for correcting crosstalk or offsets in the superconducting loop 42 created by trapped flux on-chip. Conversely, the first control line 52 is strongly coupled to the coupler 36 and used for actuating the coupler. Since current provided to the first control line 52 does not generate current in the superconducting loop 42 when the junctions 46 and 47 in the CJJ 43 are identical, the qubit 32 is protected from dissipation caused by this line.

The illustrated system 30 provides several advantages over the conventional method of using a fixed coupling. The coupling energy between the readout resonator 34 and the qubit 32 can be designed to be very large when the coupler is turned on. This will cause a very large shift in a fundamental frequency of the resonator, $f_r$, during readout, which increases the signal-to-noise ratio (SNR) of the read operation. Further, the readout cavity can be designed to be strongly coupled to the drive line, which increases the rate at which information about it can be extracted. Normally, these two design choices would reduce a coherence time of the qubit, but since the coupling is tunable, the qubit's coherence is not affected during gate operation.

For a circuit with fixed coupling, a number of design factors must be balanced. A qubit decay rate $\Gamma_q$ can be estimated according to the equation for spontaneous emission to the environment through the cavity, $$\Gamma_q = \frac{1}{T_1} = \left(\frac{g}{\Delta}\right)^2 2\pi f_r / Q_r,$$

where $\Delta = 1$ GHz is a selected detuning of the qubit from the resonator, $Q_r$ is the quality factor of the resonator, and $f_r = 9.5$ GHz. For this loss mechanism not to limit the qubit lifetime, a coherence time, $T_1 > 10^{-5}$s is required. A coupling, $g > 50$ MHz, is necessary to provide a shift, $\delta$, in the readout resonator of more than a few MHz since $\delta = g^2/\Delta$. In order to get a decent coherence time, $T_1$, the quality factor of the resonator would have to exceed five thousand, such that a time constant of the resonator would be greater than seventy nanoseconds. Integrating for several time constants could consume more than five hundred nanoseconds. If the intrinsic qubit lifetime is not much greater than that, readout visibility will be lost due to internal decay of the qubit. To increase the coupling strength, and thus the shift at the readout resonator, the quality factor must be increased so as not to affect the qubit's $T_1$ limit. Therefore, the available parameter regime is limited to low g, high $Q_r$, and long integration times, which is only adequate for qubits with long intrinsic lifetimes.

The tunable coupler allows access to a parameter regime with a fast time constant on the readout resonator 34 and strong coupling to the qubit 32 that would be infeasible with fixed coupling due to the fact that the qubit coherence time would have been too low. Since the coupling is off during gate operations, the readout resonator 34 can be implemented with a smaller quality factor, for example, on the order of five hundred. During readout, the coupling can be tuned to be very strong to provide a shift at the resonator in excess of ten megahertz. The time constant of the resonator can be less than ten nanoseconds such that the required measurement time can be much shorter. Since the linewidth of the resonator with $Q_r=500$ is nineteen megahertz, a shift of at least sixty megahertz is desirable to maximize the signal. This occurs at g=250 MHz, where the qubit lifetime during readout is one hundred thirty nanoseconds. However, since the cavity time constant is only seven nanoseconds, the measurement can be made for many cavity time constants before the qubit decays, significantly improving the sampling rate of the readout. Using the tunable coupler protects the qubit during gate operations and allows for fast measurement with high SNR during readout.

Figure 3:
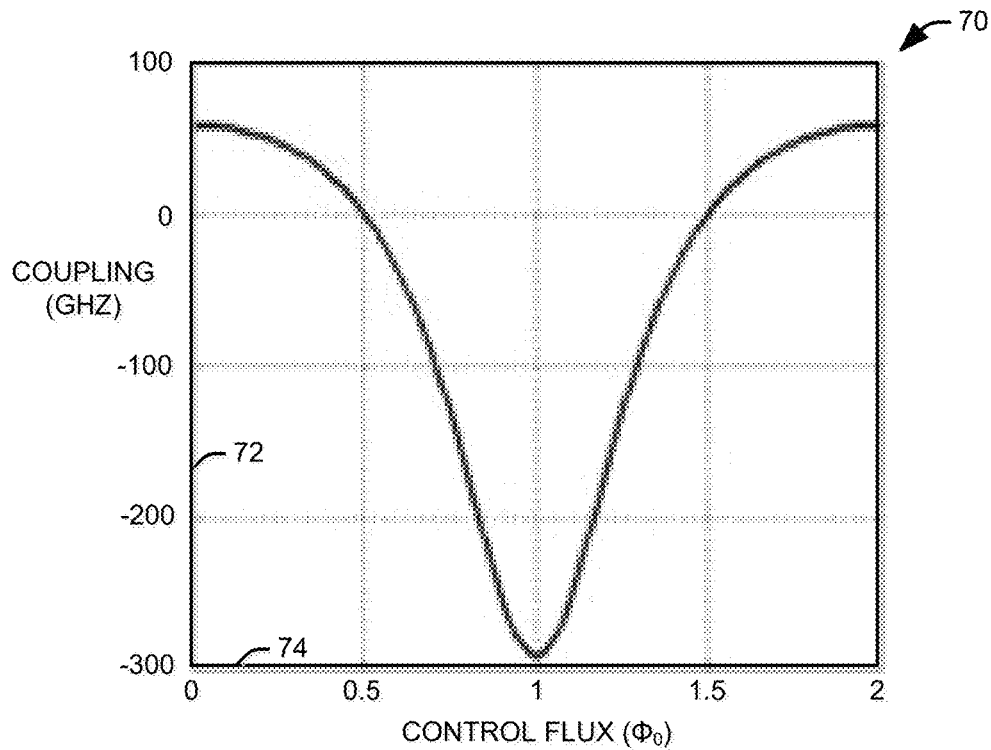
FIG. 3 is a line chart illustrating the variance of the energy of the coupling between a qubit and a readout resonator, represented in megahertz on the vertical axis, as a function of a control flux provided to the a tunable coupler, represented on the horizontal axis in units of the magnetic flux quantum.

FIG. 3 is a line chart 70 illustrating the variation of the coupling energy between the qubit 32 and the readout resonator 34, represented in megahertz on the vertical axis 72, as a function of the control flux provided to the CJJ 43, represented on the horizontal axis 74 in units of the magnetic flux quantum. For the purposes of the model illustrated in FIG. 3, it is assumed that $L_{co}$ is 146 picohenries, $I_c$ is 1.5 microamps, $M_r$ is 46 picohenries, $M_q$ is 45 picohenries, and a root mean square (RMS) current at the resonator per photon, $I_r$, is 137 nanoamps. It will be appreciated that either control line 52 or 53 could be used to tune the coupling, but the tuning is described as a function of $\Phi_\alpha$ to illustrate the device operation.

From the chart 70, it can be seen that that the coupling at $\Phi_\alpha=\Phi_0/2$ is zero, due to the fact that $\chi$ goes to 0. For $\Phi_0/2<\Phi_\alpha<\Phi_0$, $\chi$ takes on a negative value and eventually grows to be much larger, in absolute terms, than it was at $\Phi_\alpha=0$. In one implementation, this large negative coupling can be exploited to give an enhancement in the absolute coupling strength. The coupling energy, g, can be estimated as $g=I_{qu}I_rM_{eff}$, where $I_{qu}$ is the RMS current in the qubit per excitation. For $I_{qu}=50$ nA, given reasonable design parameters for the qubit, and $i_r=\sqrt{hf_r/L_r}=137$ nA, for a resonator, where $L_r=382$ pH is the total inductance of a 20Ω microstrip resonator with a fundamental frequency of $f_r=9.5$ GHz, the model predicts a very strong coupling at $\Phi_\alpha=\Phi_0$ and zero coupling at $\Phi_\alpha=\Phi_0/2$.

Returning to FIG. 2, it will be appreciated that when gate operations are performed on the qubit, the coupler 40 is turned off by providing a control flux, $\Phi_\alpha=\Omega_0/2$ so that the qubit is isolated from the resonator and the lifetime of the qubit is not reduced. For readout, a voltage pulse is applied to the $I_\alpha$ line at the bias tee 54 such that the control flux, $\Phi\alpha$, is raised to $\Phi_0$, thus turning the coupler 40 on. While the coupler 40 is on, a drive tone is applied to the readout resonator drive line at $f_r$ and the output is integrated. As discussed above, the state of the qubit 32 can be determined by determining a change in amplitude or phase in the output provided from the drive tone due to a shift in the resonant frequency of the readout resonator 34. In order to reduce the effects of capacitors on the bias line, the readout can be followed with a negative pulse of equal magnitude on the $I_\alpha$ line.

Figure 4:
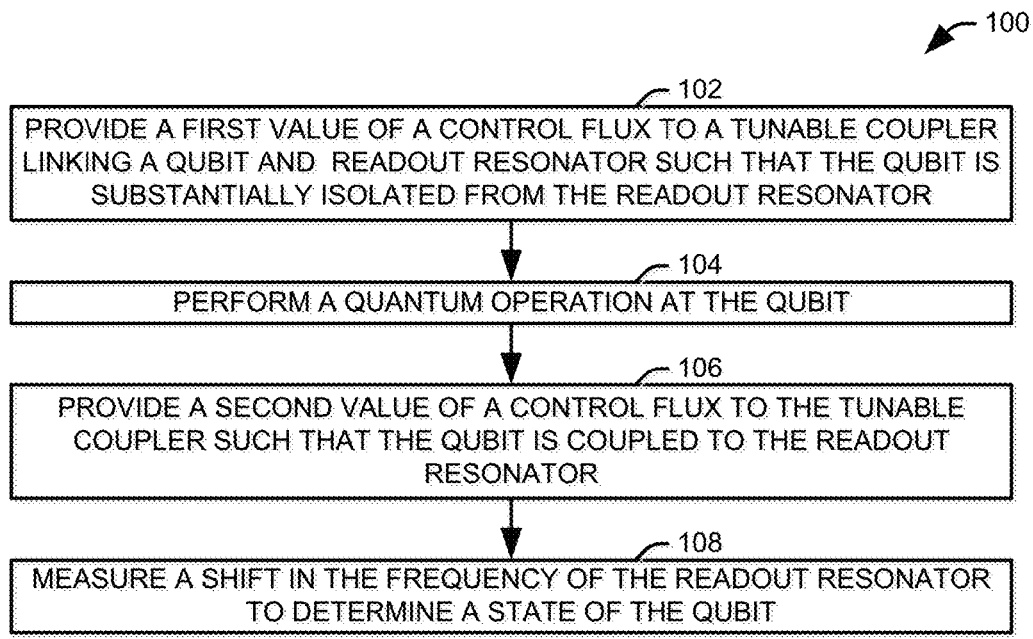
FIG. 4 illustrates a method for readout of a qubit at a readout resonator.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates a method 100 for readout of a qubit at a readout resonator. At 102, a first value of a control flux is provided to a tunable coupler linking the qubit and the readout resonator such that the qubit is substantially isolated from the readout resonator. In one implementation, the tunable coupler comprises a superconducting loop interrupted by a compound Josephson junction, and the control flux is provided to the compound Josephson junction. In this implementation, the first value for the control flux can be substantially equal to one-half of a flux quantum to provide a coupling energy substantially equal to zero. In some examples, a second control flux can also be applied directly to the superconducting loop.

At 104, at least one quantum operation is performed at the qubit while it is isolated from the readout resonator. It will be appreciated that the isolation of the qubit from the resonator and the feedline allows for an increased lifetime of the qubit. At 106, a second value of the control flux is provided to the tunable coupler such that the qubit is coupled to the readout resonator. In one implementation, the second value of the control flux is greater than one-half of a flux quantum and less than or equal to the flux quantum to provide a coupling strength having a magnitude between one hundred and three hundred megahertz. In this implementation, the coupling energy can actually be negative. Since the frequency shift at the resonator depends on the square of the coupling energy, this has no effect on the measured shift. At 108, a shift in the frequency of the readout resonator is probed to determine a state of the qubit.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system for readout of a qubit, the system comprising:
   a readout resonator coupled to a transmission line;
   a qubit;
   a compound Josephson junction coupler coupling the qubit to the readout resonator; and
   a coupling controller that controls the coupling strength of the compound Josephson junction coupler such that a coupling between the qubit and the readout resonator is a first value when a state of the qubit is being read and a second value during operation of the qubit.

2. The system of claim 1, wherein the first value represents a strong coupling between the qubit and the readout resonator, and the second value represents substantial isolation of the qubit from the readout resonator.

3. The system of claim 2, wherein the first value represents a mutual inductance between the qubit and the readout resonator having a magnitude between twenty and fifty picohenries and the second value represents a mutual inductance between the qubit and the readout resonator that is substantially equal to zero.

4. The system of claim 2, wherein the first value represents a strong, negative coupling between the qubit and the readout resonator.

5. The system of claim 1, wherein the coupling controller provides a control flux to the compound Josephson junction coupler to control the coupling strength via at least one control line.

6. The system of claim 5, wherein the compound Josephson junction coupler comprises a superconducting loop interrupted by a compound Josephson junction and the at least one control line comprises a first control line that provides a first control flux to the compound Josephson junction.

7. The system of claim 6, wherein the coupling controller provides the first control flux to be greater than one-half of a flux quantum and less than or equal to the flux quantum to provide the first value for the coupling strength and provides the first control flux as substantially equal to one-half of the flux quantum to provide the second value for the coupling strength.

8. The system of claim 6, wherein the at least one control line further comprises a second control line that provides a second control flux to the superconducting loop.

9. The system of claim 1, wherein the qubit is a transmon qubit.

10. A method for readout of a qubit at a readout resonator, comprising:
providing a first value of a control flux to a tunable coupler linking the qubit and the readout resonator such that the qubit is substantially isolated from the readout resonator;
performing a quantum operation at the qubit;
providing a second value of the control flux to the tunable coupler such that the qubit is coupled to the readout resonator;
measuring a shift in the frequency of the readout resonator to determine a state of the qubit.

11. The method of claim 10, wherein the tunable coupler comprises a superconducting loop interrupted by a compound Josephson junction, providing the first value of the control flux to the tunable coupler comprises providing control flux to the compound Josephson junction, and providing the second value of the control flux to the tunable coupler comprises providing control flux to the compound Josephson junction.

12. The method of claim 11, wherein the first value of the control flux is substantially equal to one-half of a flux quantum, and the second value of the control flux is greater than one-half of a flux quantum and less than or equal to the flux quantum.

13. The method of claim 12, wherein the first value of the control flux provides a coupling energy near zero and the second value of the control flux provides a coupling strength having a magnitude between one hundred and three hundred megahertz.

14. The method of claim 11, wherein the control flux is a first control flux, the method further comprising providing a second control flux to the superconducting loop.

15. The method of claim 10, wherein the second value of the control flux provides a strong, negative coupling between the qubit and the readout resonator.

16. A system for readout of a qubit, the system comprising:
a readout resonator coupled to a transmission line;
a qubit;
a compound Josephson junction coupler coupling the qubit to the readout resonator; and
a coupling controller that controls the coupling strength of the compound Josephson junction coupler such that a coupling between the qubit and the readout resonator is a first value, representing a strong, negative coupling between the qubit and the readout resonator, when a state of the qubit is being read and a second value, representing substantial isolation of the qubit and the resonator, during operation of the qubit.

17. The system of claim 16, wherein the first value represents a coupling energy between the qubit and the readout resonator having a magnitude between one hundred and three hundred megahertz and the second value represents a mutual inductance between the qubit and the readout resonator that is substantially equal to zero.

18. The system of claim 16, wherein the coupling controller provides a control flux to the compound Josephson junction coupler to control the coupling strength via at least one control line.

19. The system of claim 18, wherein the compound Josephson junction coupler comprises a superconducting loop interrupted by a compound Josephson junction and the at least one control line comprises a first control line that provides a first control flux to the compound Josephson junction.

20. The system of claim 19, wherein the at least one control line further comprises a second control line that provides a second control flux to the superconducting loop.

* * * * *